United States Patent
Adams et al.

(10) Patent No.: US 7,316,785 B2
(45) Date of Patent: Jan. 8, 2008

(54) METHODS AND APPARATUS FOR THE OPTIMIZATION OF ETCH RESISTANCE IN A PLASMA PROCESSING SYSTEM

(75) Inventors: Yoko Yamaguchi Adams, Fremont, CA (US); George Stojakovic, Fishkill, NY (US); Alan Miller, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 178 days.

(21) Appl. No.: 10/883,282

(22) Filed: Jun. 30, 2004

(65) Prior Publication Data

US 2006/0000797 A1    Jan. 5, 2006

(51) Int. Cl.
*C03C 25/68* (2006.01)

(52) U.S. Cl. .................. 216/67; 216/51; 216/67; 216/72; 216/79; 216/80; 216/104; 438/710; 438/723; 438/724; 438/743; 438/744

(58) Field of Classification Search .................. 134/1.1; 216/51, 67; 438/710, 723
See application file for complete search history.

(56) References Cited

U.S. PATENT DOCUMENTS

| | | | |
|---|---|---|---|
| 5,482,749 A | | 1/1996 | Telford et al. |
| 5,571,576 A | | 11/1996 | Qian et al. |
| 5,647,953 A | | 7/1997 | Williams et al. |
| 6,071,573 A | * | 6/2000 | Koemtzopoulos et al. .. 427/578 |
| 6,274,500 B1 | | 8/2001 | Xuechun et al. |
| 6,325,948 B1 | * | 12/2001 | Chen et al. .................... 216/67 |
| 6,420,274 B1 | | 7/2002 | Baker et al. |
| 6,455,333 B1 | | 9/2002 | Kathuria |
| 6,613,689 B2 | | 9/2003 | Liu et al. |
| 6,626,187 B2 | | 9/2003 | Yang et al. |
| 6,869,542 B2 | * | 3/2005 | Desphande et al. ........... 216/51 |

OTHER PUBLICATIONS

S.Wolf, Silicon Processing for the VLSI Era, vol. 1, Lattice Press, (1986), p. 581.*
S.Wolf, Silicon Processing for the VLSI Era, vol. 4, Lattice Press (2002), pp. 245-246.*
Rossnagel, Handbook of Plasma Processing Technology, Noyes Publishers (1990), p. 207.
Wolf, S., Silicon Processing for the VLSI Era, (2002) vol. 4, pp. 245 & 654.

(Continued)

*Primary Examiner*—Nadine G. Norton
*Assistant Examiner*—Maki Angadi
(74) *Attorney, Agent, or Firm*—IP Strategy Group, P.C.

(57) ABSTRACT

In a plasma processing system, including a plasma processing chamber, a method of optimizing the etch resistance of a substrate material is described. The method includes flowing pre-coat gas mixture into the plasma processing chamber, wherein the pre-coat gas mixture has an affinity for a etchant gas flow mixture; striking a first plasma from the pre-coat gas mixture; and introducing a substrate comprising the substrate material. The method also includes flowing the etchant gas mixture into the plasma processing chamber; striking a second plasma from the etchant gas mixture; and etching the substrate with the second plasma. Wherein the first plasma creates a pre-coat residual on a set of exposed surfaces in the plasma processing chamber, and the etch resistance of the substrate material is maintained.

25 Claims, 8 Drawing Sheets

OTHER PUBLICATIONS

International (PCT) Search Report, mailed Nov. 6, 2006, re PCT/US05/21047.

Written Opinion, mailed Nov. 6, 2006, re PCT/US05/21047.

Mui et al., "Integrated Optical Metrology Controls Post-Etch CDs", Jun. 2002, Semiconductor International, http://www.reed-electronics.com/semiconductor/article/CA218630.

Braun, Alexander E., "Resist Technology Concentrates on 248 nm", Feb. 2003, Semiconductor International, http://static.highbeam.com/s/semiconductorinternational/february012003/resisttechnologyconcentrateson248nm/.

Bergeron, David, "Resolution Enhancement Techniques for the 90-nm Technology Node and Beyond", Jul. 2003, Future Fab Intl., vol. 15.

International Preliminary Report on Patentability (IPRP), mailed Jan. 18, 2007, regarding PCT/US2005/021047.

* cited by examiner

METHODS AND APPARATUS FOR THE OPTIMIZATION OF ETCH RESISTANCE IN A PLASMA PROCESSING SYSTEM

BACKGROUND OF THE INVENTION

The present invention relates in general to substrate manufacturing technologies and in particular to methods and apparatus for the optimization of etch resistance in a plasma processing system.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Subsequently, control of the transistor gate critical dimension (CD) on the order of a few nanometers is a top priority, as each nanometer deviation from the target gate length may translate directly into the operational speed of these devices.

In an exemplary plasma process in which a set of gates is created on the substrate, a p-type epitaxial layer is generally disposed on the silicon substrate through chemical vapor deposition. A nitride layer may then be deposited over the epi-layer, then masked and etched according to specific patterns, leaving behind exposed areas on the epi-layer (i.e., areas no longer covered by the nitride layer.) These exposed areas may then be masked again in specific patterns before being subjected to diffusion or ion implantation to receive dopants such as phosphorus, forming n-wells.

Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Silicon dioxide may then be grown thermally to form field oxides that isolate the n-wells from other parts of the circuit. This may be followed by another masking/oxidation cycle to grow gate oxide layers over the n-wells intended for p-channel MOS transistors later on. This gate oxide layer will serve as isolation between the channel and the gate of each of these transistors. Another mask and diffusion/implant cycle may then follow to adjust threshold voltages on other parts of the epi, intended for n-channel transistors later on.

Deposition of a polysilicon layer over the wafer may then be done, to be followed by a masking/etching cycle to remove unwanted polysilicon areas, defining the polysilicon gates over the gate oxide of the p-channel transistors. At the same time, openings for the source and drain drive-ins are made on the n-wells by etching away oxide at the right locations.

Another round of mask/implant cycle may then follow, this time driving in boron dopants into new openings of the n-wells, forming the p-type sources and drains. This may then be followed by a mask/implant cycle to form the n-type sources and drains of the n-channel transistors in the p-type epi.

However, escalating requirements for high circuit density on substrates may be difficult to satisfy using current plasma processing technologies where sub-micron via contacts and trenches has high aspect ratios. In particular, it is becoming difficult to create relatively deep gate etches, especially when the gate depth is less than the illumination wavelength of the lithographic process. In one commonly used method, a photoresist mask is subsequently trimmed, using chemically dominant etch process. That is, a mask is created in which the CD of features are oversized when compared to the desired result (i.e., pre-etch CD). As the underlying substrate trench is longitudinally etched (i.e., perpendicular to the substrate), the photoresist column is also laterally etched (i.e., parallel to the substrate) or trimmed, to create the final desired gate CD.

Generally, photoresist must be optimized for both the lithographic processes (i.e., contrast, resolution, in-line roughness, etc.) and the integration processes (etch selectivity, chemical stability, ash selectivity, etc.). Those types of photoresist that tend to be susceptible to integration problems, such as chemically dominant etching, are often called "soft."

Controlling CD with soft photoresist is particularly difficult in sub-100 nm lithographic environments. That is, the photoresist must be both thin enough to avoid collapse of the photoresist column, and thick enough to be consistent with the desired etch selectivity of the etched layer. However, if the photoresist column is disproportionately tall in comparison to its width (i.e., a height to width ratio of greater than 4), the etching process may damage the column, subsequently altering the electrical and functional characteristics of the substrate, and directly impacting substrate performance and manufacturing yield.

For example, as soft photoresist is etched, wiggling or wave-like patterns may be created, potentially causing striations, false micro-loading and random etch-stop. Striations are irregularities in the shape of normal features that create additional exposure areas on the mask. Since the etchant removes unintended substrate material, the resulting electrical and functional characteristics of the wafer can be altered. One effect, for example, may be an increase in the roughness of a column face. Likewise, if a set of photoresist wiggles substantially converge, the resulting mask pattern can partially or completely block the removal of intended substrate material.

False micro-loading occurs when artifacts of the substrate remain on the column trench floor, creating a physically uneven bottom surface. Random edge-stop occurs when column entrances are effectively blocked from the etchant gas during the etching process. In some circumstances, where the column is disproportionately tall and thin (i.e., a height to width ratio of greater than 4), an entire slice of the photoresist column may be accidentally removed or stripped. Additionally, the photoresist column may buckle, bend, or twist by non-uniform stress caused when the lateral etch rate is different than the longitudinal etch rate.

Figure 1:
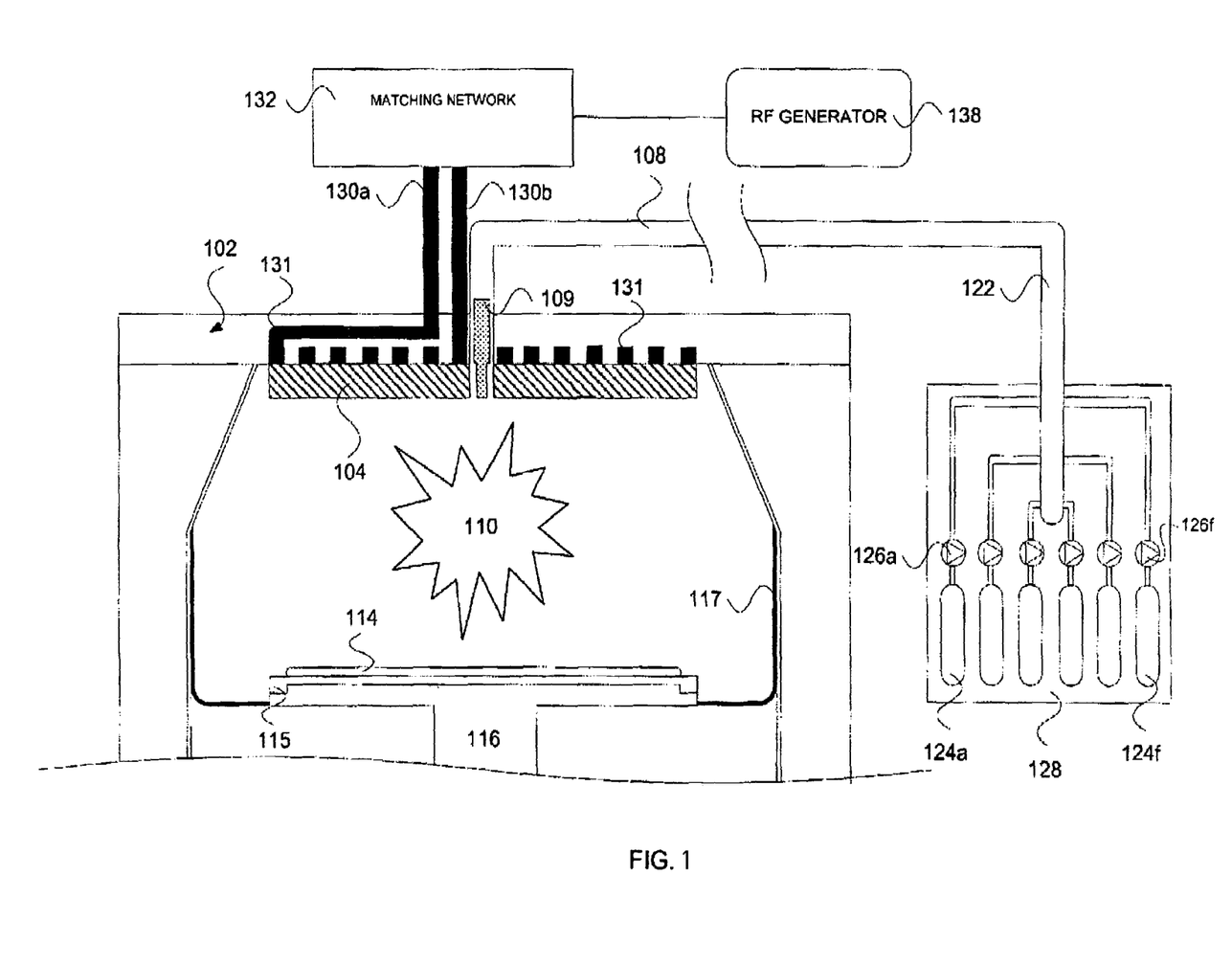
FIG. 1 illustrates a simplified diagram of plasma processing system components.

Referring now to FIG. 1, a simplified diagram of plasma processing system components is shown. Generally, an appropriate set of gases is flowed into chamber 102 through an inlet 108 from gas distribution system 122. These plasma processing gases may be subsequently ionized to form a plasma 110, in order to process (e.g., etch or deposition) exposed areas of substrate 114, such as a semiconductor substrate or a glass pane, positioned with edge ring 115 on an electrostatic chuck 116. In addition, liner 117 provides a thermal barrier between the plasma and the plasma processing chamber, as well as helping to optimize plasma 110 on substrate 114.

Gas distribution system 122 is commonly comprised of compressed gas cylinders 124a-f containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a-f may be further protected by an enclosure 128 that provides local exhaust ventilation. Mass flow controllers 126a-f are commonly a self-contained devices (consisting of a transducer, control valve, and control and signal-processing electronics) commonly used in the semiconductor industry to measure and regulate the mass flow of gas to the plasma processing system. Injector 109 introduces plasma processing gases 124 as an aerosol into chamber 102.

Induction coil 131 is separated from the plasma by a dielectric window 104, and generally induces a time-varying electric current in the plasma processing gases to create plasma 110. The window both protects induction coil from plasma 110, and allows the generated RF field to penetrate into the plasma processing chamber. Further coupled to induction coil 131 at leads 130a-b is matching network 132 that may be further coupled to RF generator 138. Matching network 132 attempts to match the impedance of RF generator 138, which typically operates at 13.56 MHz and 50 ohms, to that of the plasma 110.

Generally, some type of cooling system is coupled to the chuck in order to achieve thermal equilibrium once the plasma is ignited. The cooling system itself is usually comprised of a chiller that pumps a coolant through cavities in within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

Figure 2A:
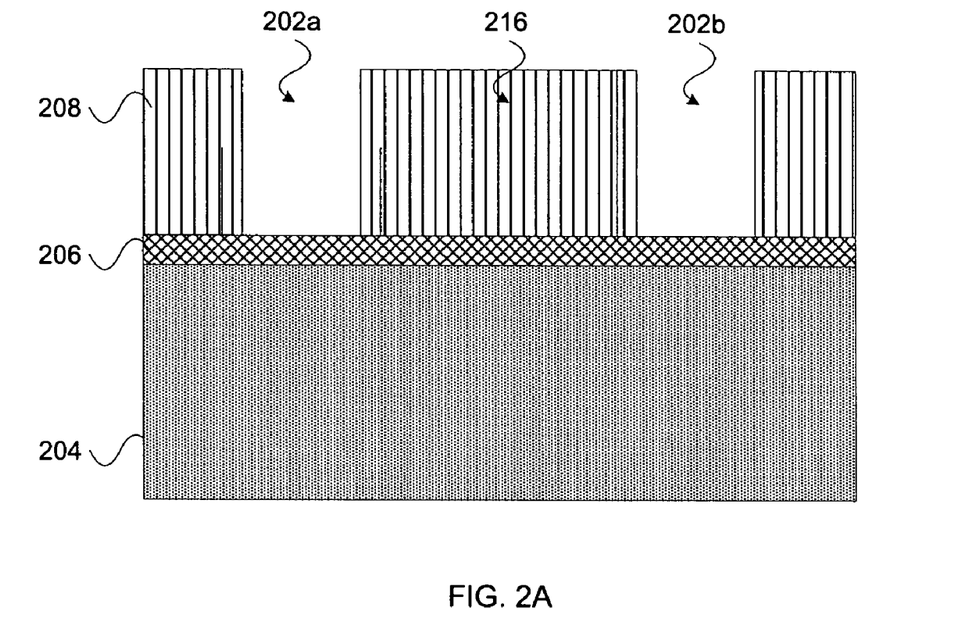
FIGS. 2A-2B illustrate a set of idealized cross-sectional views of a layer stack, representing the layers of an exemplar semiconductor IC.
Figure 2B:
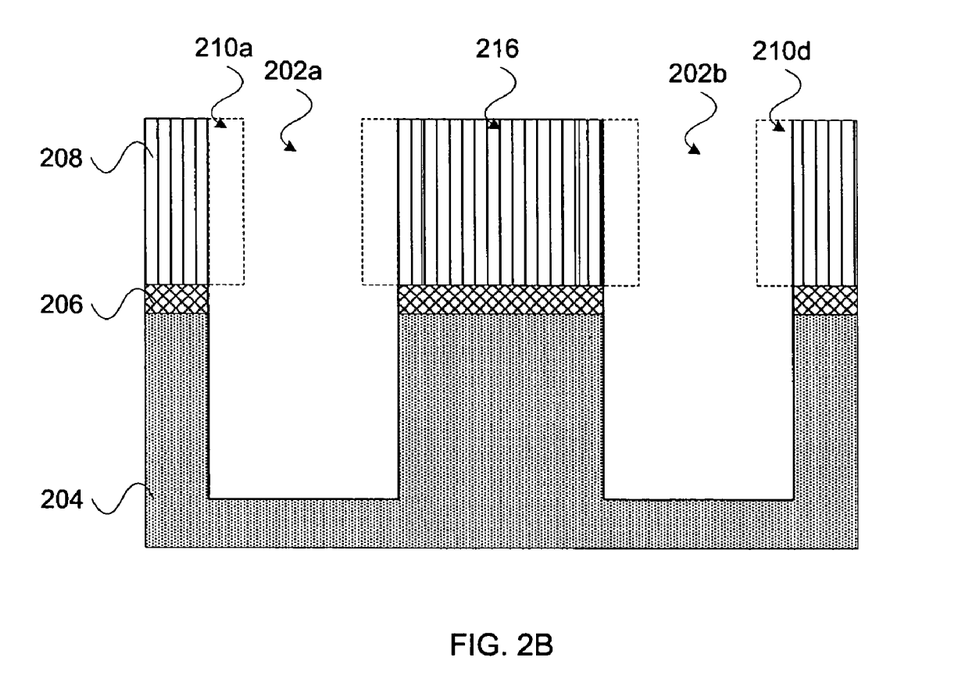

Referring now to FIGS. 2A-B, an idealized cross-sectional view of the layer stack is shown, in which a set of gates are manufactured in a plasma process. FIG. 2A illustrates an idealized cross-sectional view of the layer stack, representing the layers of an exemplar semiconductor IC, prior to a lithographic step. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of the layer stack, there is shown a layer 204, comprising a semi-conductor, such as polysilicon. Above layer 204 is disposed a photoresist mask layer 208 and a BARC layer 206 is that have been processed through lithography. In this example, a photoresist mask pattern 216 is first lithographically created, and then chemically trimmed in order to create a set of gate trenches 202a-b.

FIG. 2B shows the cross-sectional view of the layer stack of FIG. 2A after layer 204 has been etched in a plasma processing system in order to create a set of gates by further extending trench 202a-b. In addition, the photoresist mask layer, as well and the underlying semi-conductor layer 204, are laterally trimmed by an etchant by an amount 210.

Figure 3A:
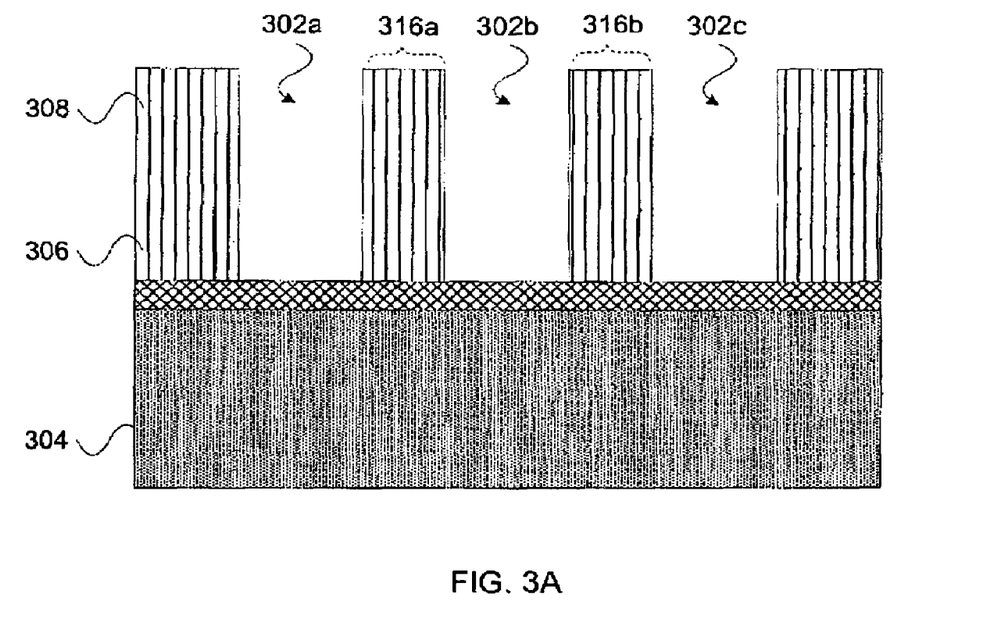
FIGS. 3A-3C illustrate a set of idealized cross-sectional views of a layer stack, representing the layers of an exemplar semiconductor IC, in which the photoresist column has collapsed.
Figure 3B:
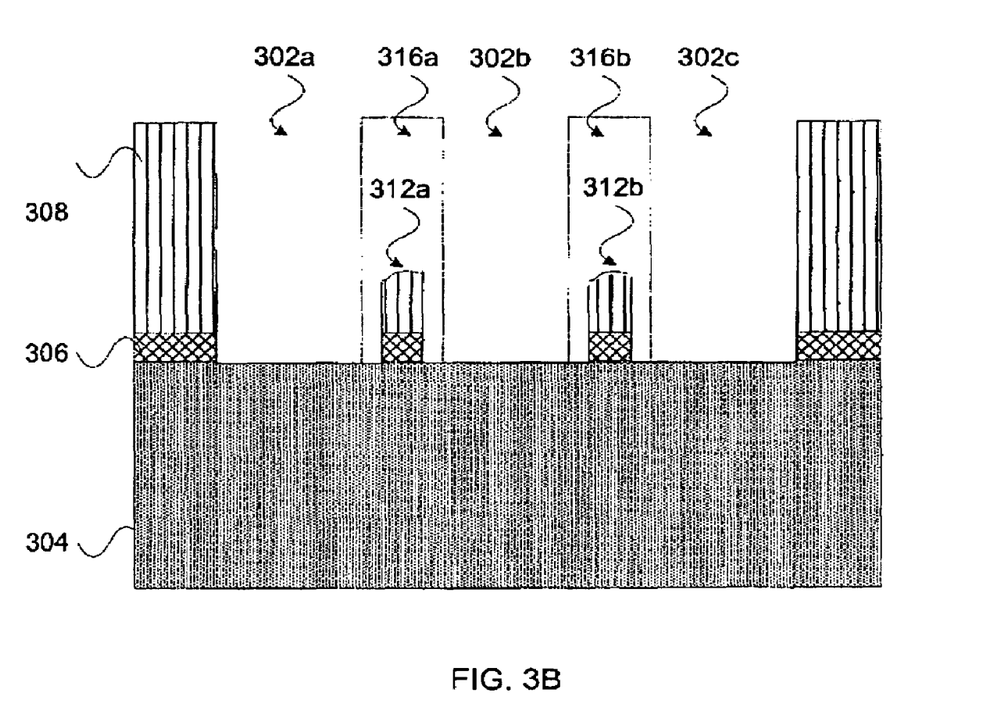
Figure 3C:
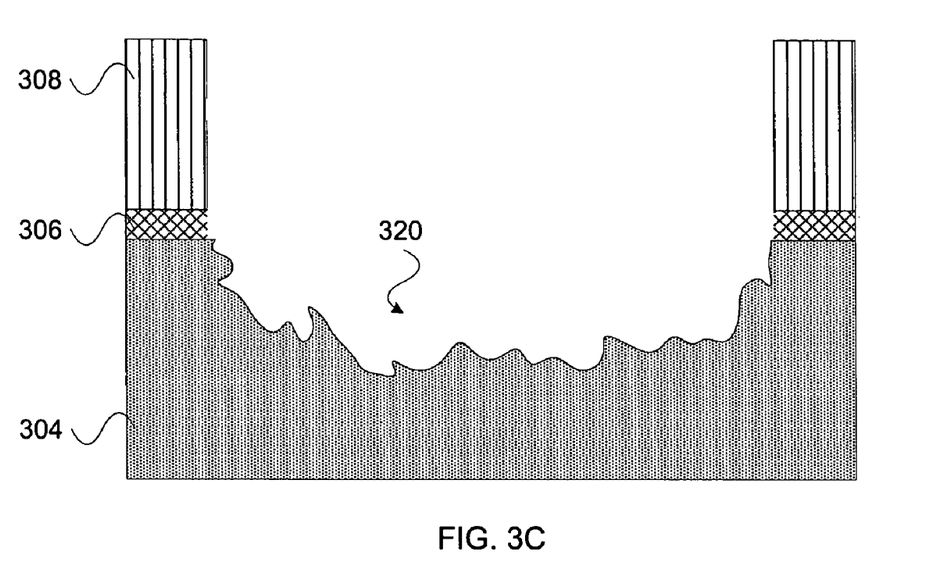

Referring now to FIGS. 3A-C, an idealized cross-sectional view of the layer stack in which a disproportionately tall soft photoresist column has collapsed during the plasma process. During the etching process, photoresist material may be generally removed either laterally (i.e., parallel to the substrate), or longitudinally (i.e. perpendicular to the substrate.) However, if the column width is sufficiently minimized, the combination of lateral and longitudinal etching produces an effective diagonal etch vector that may remove a substantially large portion of the column, subsequently damaging the underlying substrate.

FIG. 3A illustrates an idealized cross-sectional view of the layer stack, representing the layers of an exemplar semiconductor IC, prior to a lithographic step. At the bottom of the layer stack, there is shown a layer 304, comprising a semi-conductor, such as polysilicon. Above layer 304 is disposed a photoresist mask layer 308 and a BARC layer 306 is that have been processed through lithography. In this example, a photoresist mask pattern is created with a set of trenches 302a-c to create a set of gates.

FIG. 3B shows the cross-sectional view of the layer stack of FIG. 3A after photoresist layer 308 has been etched in a plasma processing system. However, unlike column 216 of FIGS. 2A-B, the relatively thinner columns 316 have been substantially damaged 312 by the etching process. That is, instead of just being reduced in width, the columns are also catastrophically reduced in height.

FIG. 3C shows the cross-sectional view of the layer stack of FIG. 3B after layer 304 has been etched in a plasma processing system, creating a cavity 320 in substrate 304.

Figure 4A:
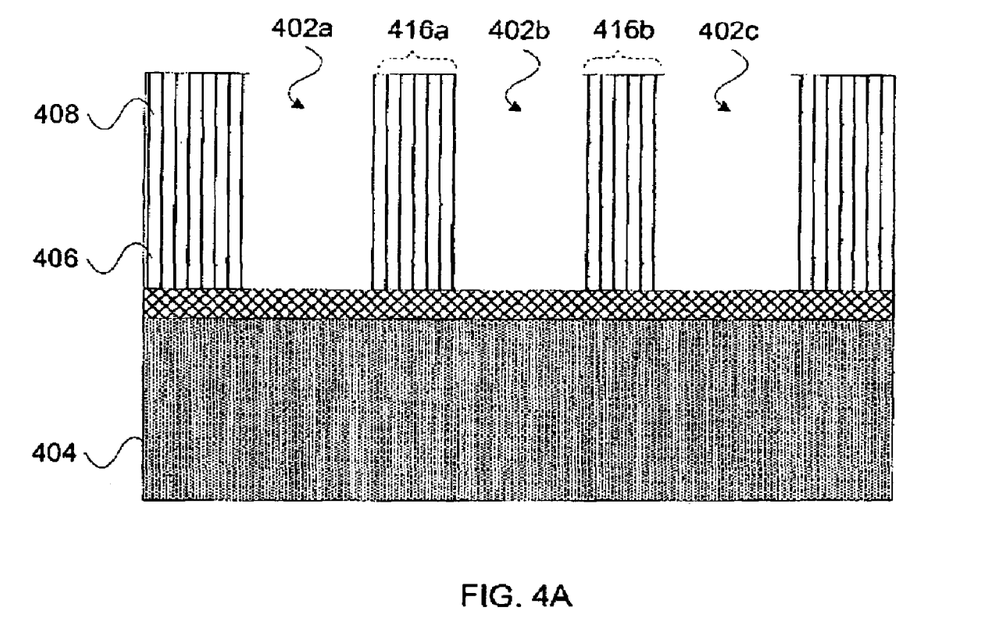
FIGS. 4A-4B illustrate a set of idealized cross-sectional views of a layer stack, representing the layers of an exemplar semiconductor IC, in which the photoresist column has twisted.
Figure 4B:
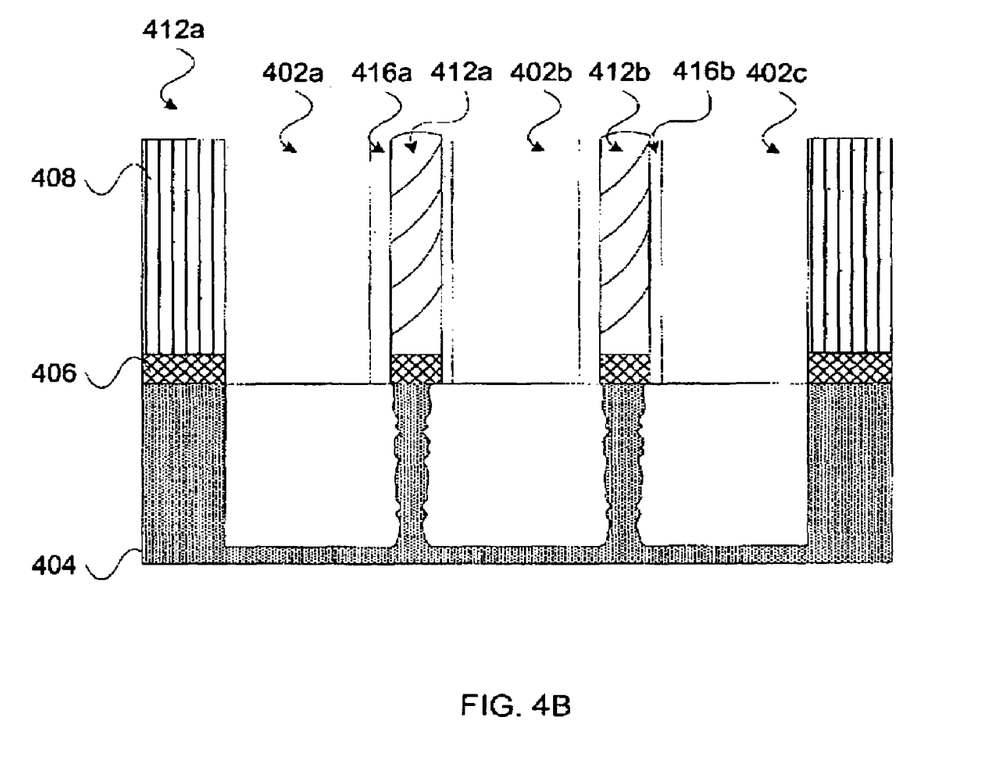

Referring now to FIGS. 4A-C, an idealized cross-sectional view of the layer stack in which a disproportionately tall soft photoresist column has twisted during the plasma process. As previously described, photoresist material may be generally removed either laterally (i.e., parallel to the substrate), or longitudinally (i.e. perpendicular to the substrate.) However, if the column width is sufficiently minimized, the combination of lateral and longitudinal etching may create stress on the column sufficient to twist or bend it.

FIG. 4A illustrates an idealized cross-sectional view of the layer stack, representing the layers of an exemplar semiconductor IC, prior to a lithographic step. At the bottom of the layer stack, there is shown a layer 404, comprising a semi-conductor, such as polysilicon. Above layer 404 is disposed a photoresist mask layer 408 and a BARC layer 406 is that have been processed through lithography. In this example, a photoresist mask pattern is created with a set of trenches 402a-c to create a set of gates.

FIG. 4B shows the cross-sectional view of the layer stack of FIG. 4A after photoresist layer 408 has been etched in a plasma processing system. However, unlike column 216 of FIGS. 2A-B, the relatively thinner columns 416 have been substantially twisted 412 by the etching process, subsequently creating non-linear profiles in the underlying substrate 404.

In view of the foregoing, there are desired improved methods for methods and apparatus for the optimization of etch resistance in a plasma processing system.

SUMMARY OF THE INVENTION

The invention relates, in one embodiment, in a plasma processing system, including a plasma processing chamber, to a method of optimizing the etch resistance of a substrate material. The method includes flowing pre-coat gas mixture into the plasma processing chamber, wherein the pre-coat gas mixture has an affinity for a etchant gas flow mixture; striking a first plasma from the pre-coat gas mixture; and introducing a substrate comprising the substrate material. The method also includes flowing the etchant gas mixture into the plasma processing chamber; striking a second plasma from the etchant gas mixture; and etching the substrate with the second plasma. Wherein the first plasma creates a pre-coat residual on a set of exposed surfaces in the plasma processing chamber, and the etch resistance of the substrate material is maintained.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously stated, relatively deep gate etches are difficult to obtain using soft photoresist (i.e., photoresist that tends to be susceptible to integration problems). In particular, if the photoresist column is disproportionately tall in comparison to its width (i.e., a height to width ratio of greater than 4), the etching process may damage the column, and subsequently the gate substrate.

For example, non-uniform stress on the photoresist column may cause it to buckle, bend, or twist. Likewise, facets or non-linear profiles may be created only the column wall, which tend to cause substantial defects in the underlying substrate. In some circumstances, where the column is disproportionately tall and thin, an entire slice of the photoresist column may be accidentally removed or stripped, further damaging the CD profile and the substrate. Traditional passivation techniques are generally ineffective because although the relative CD profile may be maintained, the absolute CD size may also be subsequently increased by the addition of a passivation layer.

While not wishing to be bound by theory, it is believed by the inventor herein that pre-coating the plasma processing chamber with a material that has an affinity (or attraction) to the etchant (such as photoresist etchant), the selectivity of the etchant can be optimized, as well as the integrity of the material being etched.

Generally, after each set of plasma processing steps, a dry cleaning, waferless cleaning, or preventive maintenance procedure is performed to remove micro-particles and residue polymers that are attached to the interior surfaces of the reaction chamber. In a non-obvious fashion, by pre-coating the plasma chamber prior to insertion of a subsequent substrate, by a material to which an etchant has an affinity, the effective amount of etchant radicals in the plasma may be reduced, thus optimizing the etch rate (e.g., in order to maintain photoresist integrity, etc.).

For example, many photoresist etchants comprise oxygen. Pre-coating the chamber with a material to which oxygen has an affinity, such as $Cl_2$, will reduce the effective amount of oxygen radicals in the plasma that are available to etch the photoresist. In general, the greater the amount of pre-coat material, the fewer the number of available oxygen radicals available to the etching process. In addition, a controllable polymer passivation layer may be created through reaction of the pre-coat with the photoresist etchant, further optimizing the etching process in order to preserve photoresist integrity. That is, the polymer passivation layer may inhibit both vertical erosion of the photoresist mask and lateral erosion, which may be valuable in maintaining the CD of the substrate.

In U.S. Pat. No. 6,455,333, there is proposed a method of stabilizing a deep ultraviolet (DUV) resist etch rate by conditioning (seasoning) an etch chamber with a conditioning wafer having a unique stack which results in consistent and stable DUV resist etch rates. However, unlike the present invention which preserves photoresist integrity in a non-obvious fashion, this method merely stabilizes an etch rate. In addition, the method specifically involves the use of a conditioning wafer to season the chamber, an element not taught in the present invention.

In U.S. Pat. No. 6,626,187, there is proposed a method of reconditioning the reaction chamber of an etching reactor. However, unlike the present invention which preserves photoresist integrity in a non-obvious fashion, this method merely stabilizes the etching process by allowing gaseous nitrogen and hydrogen to react with a substrate to create high molecular weight particles.

In U.S. Pat. No. 6,420,274, there is proposed a method of conditioning the surfaces of a chamber with process molecules, molecular fragments and atoms thereon. However, unlike the present invention which preserves photoresist integrity in a non-obvious fashion, this method merely conditions the chamber in order to achieve a repeatable plasma process.

In U.S. Pat. No. 6,274,500, there is proposed a method of cleaning and seasoning of a plasma etch chamber. However, unlike the present invention which preserves photoresist integrity in a non-obvious fashion, this method merely first cleans and then seasons the plasma chamber in order achieve a repeatable plasma process. In addition, the method specifically involves the use of a conditioning wafer to season the chamber, an element not taught in the present invention.

Other prior art disclose the use of a $CH_xF_y$ pre-coat method for spacer etch application. However, unlike the present invention which preserves photoresist integrity in a non-obvious fashion, this type of method seals metal molecules in an prevents high level of metal contamination such as Chromium.

Figure 5:
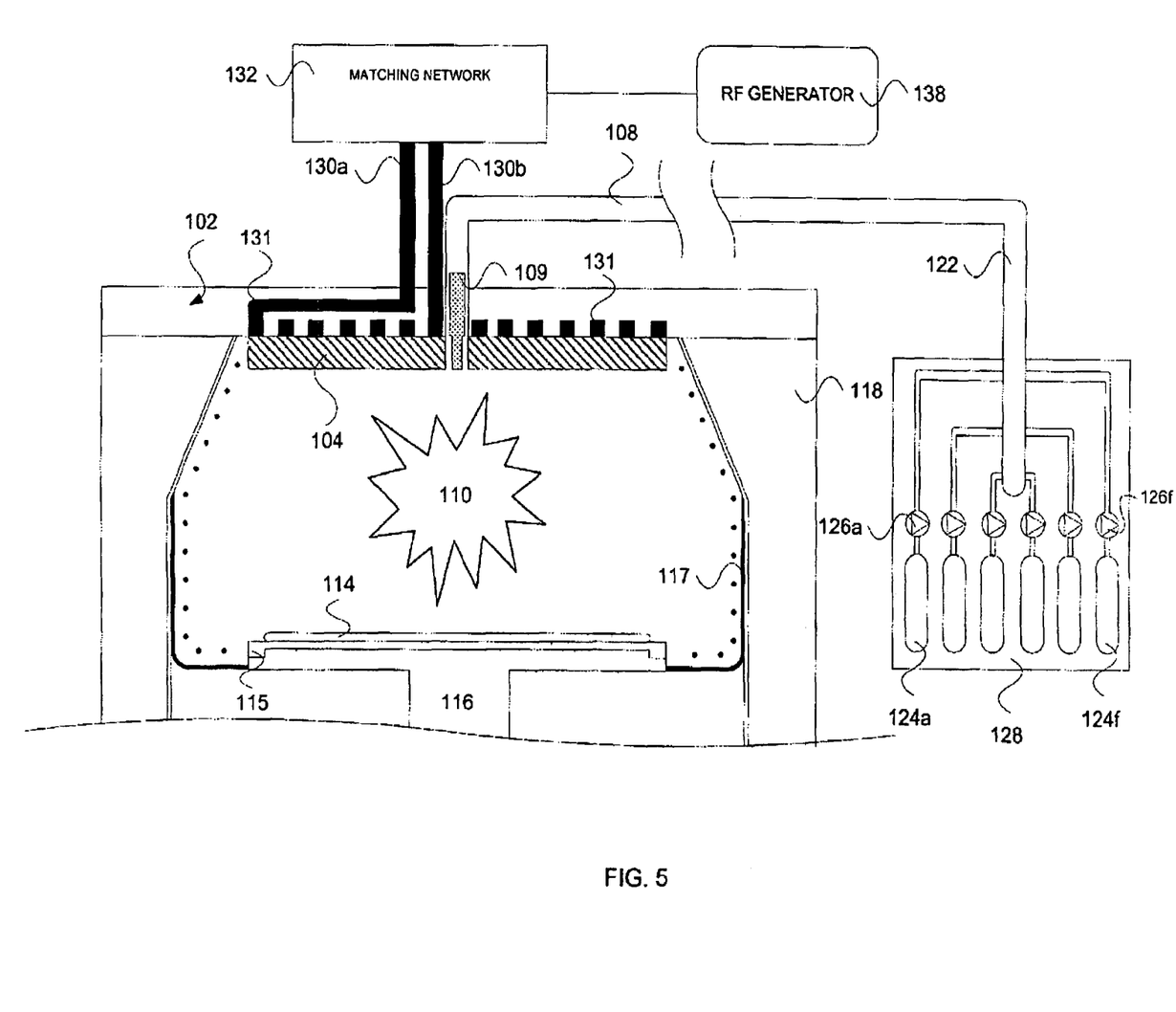
FIG. 5 illustrates a simplified diagram of plasma processing system with the addition of pre-coat, according to one embodiment of the invention.

Referring now to FIG. 5, a simplified diagram of plasma processing system of FIG. 1 is shown, with the addition of pre-coat, according to one embodiment of the invention. As previously stated, an appropriate set of gases is flowed into chamber 102 through an inlet 108 from gas distribution system 122. These plasma processing gases may be subsequently ionized to form a plasma 110, in order to process (e.g., etch or deposition) exposed areas of substrate 114, such as a semiconductor substrate or a glass pane. However, prior to this step, a pre-coat 117 (e.g.,. $O_2$, HBr, $Cl_2$, He, $N_2$, Ar, $CF_4$, $CH_2F_2$, $CHF_3$, $SiCl_4$, $SF_6$, $NF_3$, etc.) has been added that may react with photoresist etchant radicals to subsequently optimize the etching process.

Figure 6A:
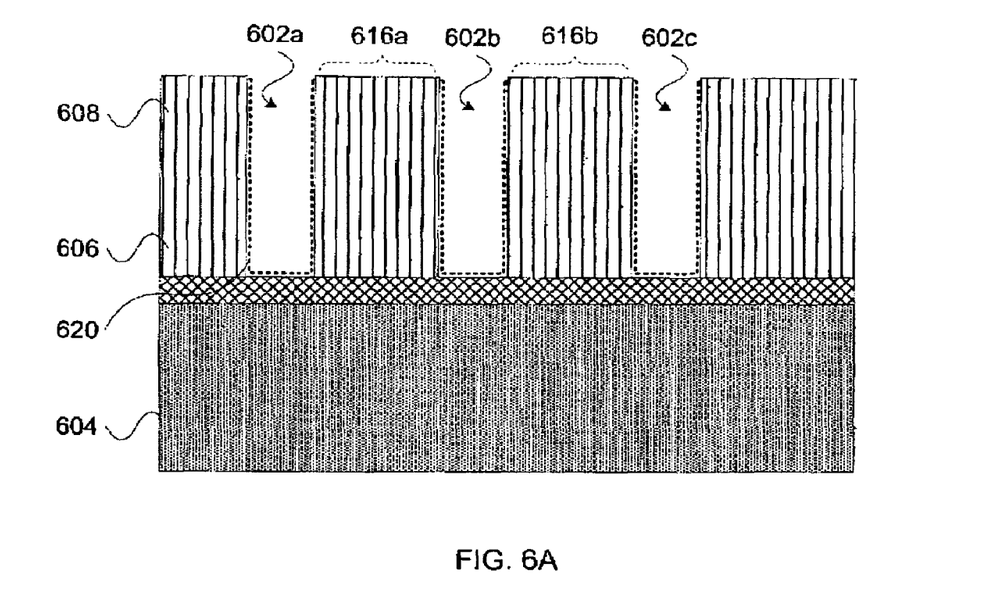
FIGS. 6A-6B illustrate an idealized cross-sectional view of the layer stack in which a pre-coat has optimized the trim process, according to one embodiment of the invention.
Figure 6B:
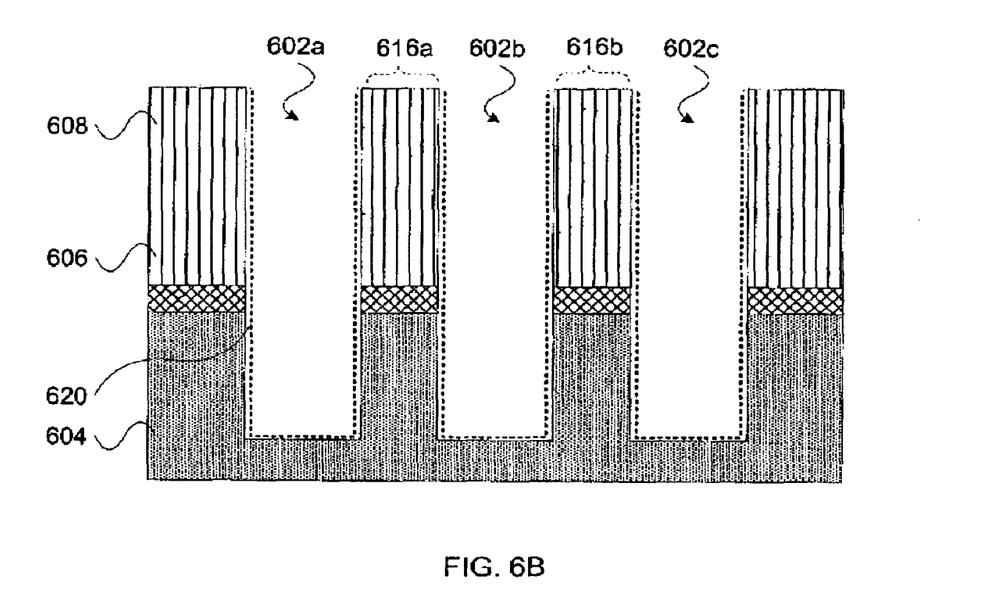

Referring now to FIGS. 6A-B, an idealized cross-sectional view of the layer stack is shown, in which a pre-coat has optimized the trim process, according to one embodiment of the invention. FIG. 6A illustrates an idealized cross-sectional view of the layer stack, representing the layers of an exemplar semiconductor IC, prior to a lithographic step. At the bottom of the layer stack, there is shown a layer 604, comprising a semi-conductor, such as polysilicon. Above layer 604 is disposed a photoresist mask layer 608 and a BARC layer 606 is that have been processed through lithography. However, unlike FIGS. 3A-C and FIGS. 4A-B, a passivation layer 620 has formed in trench 602 that preserves photoresist integrity, and allows the CD of trench 602 to be maintained.

FIG. 6B shows the cross-sectional view of the layer stack of FIG. 6A after layer 604 has been etched in a plasma processing system in order to create a set of gates by further extending trench 606a-c into semi-conductor layer 604.

In one embodiment, for a trim process application, the plasma processing chamber is coated with a mixture including at least one gas selected from the list: $O_2$, HBr, $Cl_2$, He, $N_2$, $CF_4$, and Ar.

In another embodiment, for a BARC etch process application, the plasma processing chamber is coated with a mixture including at least one gas selected from the list: $O_2$, HBr, $Cl_2$, He, $N_2$, Ar, $CF_x(CF_4)$, $CH_xF_y(CH_2F_2, CHF_3$ etc.), $SiCl_4$, $SF_6$, and $NF_3$.

In another embodiment, for an inorganic material etch process application, the plasma processing chamber is coated with a mixture including at least one gas selected from the list: $O_2$, HBr, $Cl_2$, He, $N_2$, Ar, $CF_x(CF_4)$, $CH_xF_y(CH_2F_2, CHF_3$ etc.), $SF_6$, and $NF_3$.

In another embodiment, for a silicon etch (i.e., poly, a-Si, Epi, etc.) process application, the plasma processing chamber is coated with a mixture including at least one gas selected from the list: $O_2$, HBr, $Cl_2$, He, $N_2$, Ar, $CF_x(CF_4)$, $CH_xF_y(CH_2F_2, CHF_3$ etc.), $SiCl_4$, $SF_6$, and $NF_3$.

In another embodiment, in a 2300 Versys™ series plasma processing system (e.g., 2300 Versys™, 2300 Versys Star™, 2300 Versys Kiyo™, etc.), a precoat at a chamber pressure of about 5 to about 100 mT, a TCP power of about 350 to about 1400 W, a bias power of about 0 to about 20 W, a flow of about $CH_2F_2$ of about 50 to about 250 sccm, a flow of $CF_4$ of about 5 to about 150 sccm, a temperature of about 20° to about 60°, and a time of about 5 to about 30 seconds is sufficient to optimize the photoresist etch rate.

In another embodiment, in a 2300 Versys™ series plasma processing system, a precoat at a chamber pressure of about 30 to about 80 mT, a TCP power of about 600 to about 1200 W, a bias power of about 0 to about 10 W, a flow of about $CH_2F_2$ of about 50 to about 150 sccm, a flow of $CF_4$ of about 10 to about 80 sccm, a temperature of about 30° to about 50°, and a time of about 5 to about 15 seconds is sufficient to optimize the photoresist etch rate.

In another embodiment, in a 2300 Versys Star™ plasma processing system, a precoat at a chamber pressure of about 50 to about 70 mT, a TCP power of about 900 to about 1100 W, a bias power of about 0 to about 5 W, a flow of about $CH_2F_2$ of about 75 to about 105 sccm, a flow of $CF_4$ of about 20 to about 40 sccm, a temperature of about 30° to about 50°, and a time of about 5 to about 15 seconds is sufficient to optimize the photoresist etch rate.

In another embodiment, a pre-coat process can be used as a pre-etch plasma processing chamber conditioning step, where the chamber is coated before the substrate is input for etching.

In another embodiment, a substrate can be placed inside the plasma process chamber for etch, a trim process can be subsequently used to shrink the CD (e.g., line width, etc.) to the target size, the substrate can be removed, the pre-coat step run, and then the substrate re-inserted to complete the etching of the full stack.

In another embodiment, two plasma processing chambers can be used to complete an etch sequence. In a first chamber, the CD (e.g., line width, etc.) is trimmed to the target size. Subsequently, in a second chamber, a pre-coat may be applied prior to the insertion of a substrate for the remaining stack etch.

Figure 7:
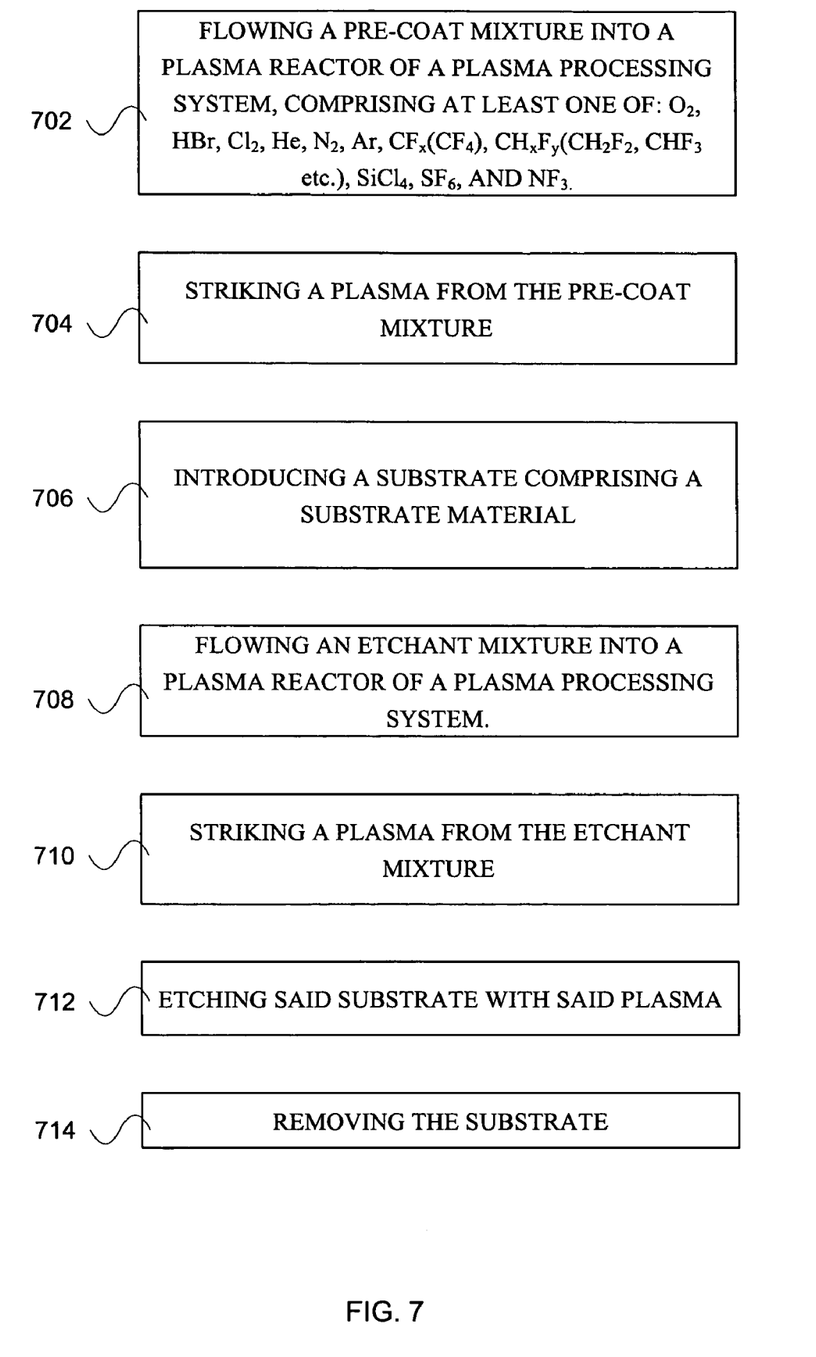
FIG. 7 shows a simplified process for etching a substrate in a plasma processing system to which a pre-coat has been added, according to one embodiment of the invention.

Referring now to FIG. 7, a simplified process is shown for etching a substrate in a plasma processing system to which a pre-coat has been added, according to one embodiment of the invention. Initially, at step 702, a pre-coat mixture is flowed into a plasma chamber of a plasma processing system, comprising at least one of: $O_2$, HBr, $Cl_2$, He, $N_2$, Ar, $CF_x(CF_4)$, $CH_xF_y(CH_2F_2, CHF_3$ etc.), $SiCl_4$, $SF_6$, and $NF_3$. Next, a plasma is struck from the pre-coat mixture, at step 704. Next, a substrate comprising a substrate material (e.g., photoresist, BARC, etc.) is introduced into the plasma reactor, at step 706. Next, an etchant mixture is flowed into a plasma reactor of a plasma processing system, at step 708. The plasma is then struck from the etchant mixture, at step 710. The substrate is etched with the plasma, at step 712. And finally, the substrate is removed at step 714.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™HPT, 2300™, Versys™ Star, etc.), other plasma processing systems may be used. This invention may also be used with substrates of various diameters (e.g., 200 mm, 300 mm, etc.). Also, photoresist plasma etchants comprising gases other than oxygen may be used. In addition, the etching of other types of substrate materials may be optimized with the current invention. It should also be noted that there are many alternative ways of implementing the methods of the present invention.

Advantages of the invention include the optimization of etch resistance in a plasma processing system. Additional advantages may include the minimization of photoresist damage due to exposure to oxygen-based etchants, the minimization of trench and via faceting and fencing during the etch process, the use of a pre-coat as an etch parameter, and the substantial maintenance of substrate-to-substrate repeatability.

Having disclosed exemplary embodiments and the best mode, modifications and variations may be made to the disclosed embodiments while remaining within the subject and spirit of the invention as defined by the following claims.

What is claimed is:

1. In a plasma processing system including a plasma processing chamber, a method of improving processing selectivity in processing a substrate, the method comprising:
    flowing a pre-coat gas mixture into said plasma processing chamber, wherein said pre-coat gas mixture has an affinity to process gas mixture;
    striking a first plasma from said pre-coat gas mixture;
    introducing said substrate into said plasma processing chamber;
    flowing said process gas mixture into said plasma processing chamber;
    striking a second plasma from said process gas mixture; and
    performing at least one of etching and deposition on said substrate with said second plasma,
    wherein said first plasma creates a pre-coat on a set of surfaces of said plasma processing chamber, said pre-coat configured to attract at least an amount of radicals in said second plasma.

2. The method of claim 1, further comprising cleaning said plasma processing chamber using a waferless chamber cleaning process, prior to said flowing said pre-coat gas mixture.

3. The method of claim 1, wherein said process gas mixture includes an etchant species.

4. The method of claim 3, wherein said pre-coat chemically interacts with said etchant species to create a passivation species.

5. The method of claim 4, wherein said passivation species coats at least a portion of said substrate.

6. The method of claim 1, wherein said processing selectivity represents etching selectivity in etching a photoresist.

7. The method of claim 1, wherein said processing selectivity represents etching selectivity in etching a BARC.

8. The method of claim 1, wherein said processing selectivity represents etching selectivity in etching an inorganic material.

9. The method of claim 1, wherein said processing selectivity represents etching selectivity in etching silicon.

10. The method of claim 1, wherein said pre-coat gas mixture comprises $O_2$.

11. The method of claim 1, wherein said pre-coat gas mixture comprises HBr.

12. The method of claim 1, wherein said pre-coat gas mixture comprises $Cl_2$.

13. The method of claim 1, wherein said pre-coat gas mixture comprises He.

14. The method of claim 1, wherein said pre-coat gas mixture comprises $N_2$.

15. The method of claim 1, wherein said pre-coat gas mixture comprises Ar.

16. The method of claim 1, wherein said pre-coat gas mixture comprises $CF_4$.

17. The method of claim 1, wherein said pre-coat gas mixture comprises $CH_2F_2$.

18. The method of claim 1, wherein said pre-coat gas mixture comprises $CHF_3$.

19. The method of claim 1, wherein said pre-coat gas mixture comprises $CH_xF_y$, wherein x and y are integers.

20. The method of claim 1, wherein said pre-coat gas mixture comprises $SiCl_4$.

21. The method of claim 1, wherein said pre-coat gas mixture comprises $SF_6$.

22. The method of claim 1, wherein said pre-coat gas mixture comprises $NF_3$.

23. The method of claim 1, wherein said substrate is semiconductor wafer.

24. The method of claim 1, wherein said substrate is a glass panel.

25. A plasma processing system, for processing a substrate with a plasma the plasma, processing system comprising:
    a plasma a processing chamber; and
    a pre-coat disposed on a set of surfaces of said plasma processing chamber,
    wherein said pro-coat is configured to attract a least an amount of process radicals of said plasma when said plasma is performing at least one of etehing and deposition on said substrate inside said plasma processing chamber.

* * * * *